US005627396A

United States Patent [19]

James et al.

[11] Patent Number: 5,627,396

[45] **Date of Patent: *May 6, 1997**

[54] MICROMACHINED RELAY AND METHOD OF FORMING THE RELAY

[75] Inventors: Christopher D. James, Carlsbad; Henry S. Katzenstein, Arroyo Grande, both of Calif.

[73] Assignee: Brooktree Corporation, San Diego, Calif.

[ * ] Notice: The term of this patent shall not extend beyond the expiration date of Pat. No. 5,479,042.

[21] Appl. No.: 443,456

[22] Filed: May 18, 1995

Related U.S. Application Data

[63] Continuation of Ser. No. 12,055, Feb. 1, 1993, Pat. No. 5,479,042.

[51] Int. Cl.[6] .................... H01L 29/82

[52] U.S. Cl. .................... 257/415; 257/622; 200/83 N; 200/83 V

[58] Field of Search .................... 257/417, 418, 257/419, 415, 532, 622; 200/181, 244, 283, 292, 83 N, 83 V, 83 Y; 307/130, 132 E, 143

[56] References Cited

U.S. PATENT DOCUMENTS 5,479,042 12/1995 James et al. .................... 257/415

*Primary Examiner*—Ngân V. Ngô

*Attorney, Agent, or Firm*—Ellsworth R. Roston; Charles H. Schwartz

[57] ABSTRACT

A bridging member extending across a cavity in a semiconductor substrate (e.g. signal crystal silicon) has successive layers—a masking layer, an electrically conductive layer (e.g. polysilicon) and an insulating layer (e.g. $SiO_2$). A first electrical contact (e.g. gold coated with ruthenium) extends on the insulating layer in a direction perpendicular to the extension of the bridging member across the cavity. A pair of bumps (e.g. gold) are on the insulating layer each between the contact and one of the cavity ends. Initially the bridging member and then the contact and the bumps are formed on the substrate and then the cavity is etched in the substrate through holes in the bridging member. A pair of second electrical contacts (e.g. gold coated with ruthenium) are on the surface of an insulating substrate (e.g. pyrex glass) adjacent the semiconductor substrate. The two substrates are bonded after the contacts are cleaned. The first contact is normally separated from the second contacts because the bumps engage the insulating substrate surface. When a voltage is applied between an electrically conductive layer on the insulating substrate surface and the polysilicon layer, the bridging member is deflected so that the first contact engages the second contacts. Electrical leads extend on the surface of the insulating substrate from the second contacts to bonding pads disposed adjacent a second cavity in the semiconductor substrate. The resultant relays on a wafer may be separated by sawing the semiconductor and insulating substrates at the position of the second cavity in each relay to expose the pads for electrical connections.

43 Claims, 4 Drawing Sheets

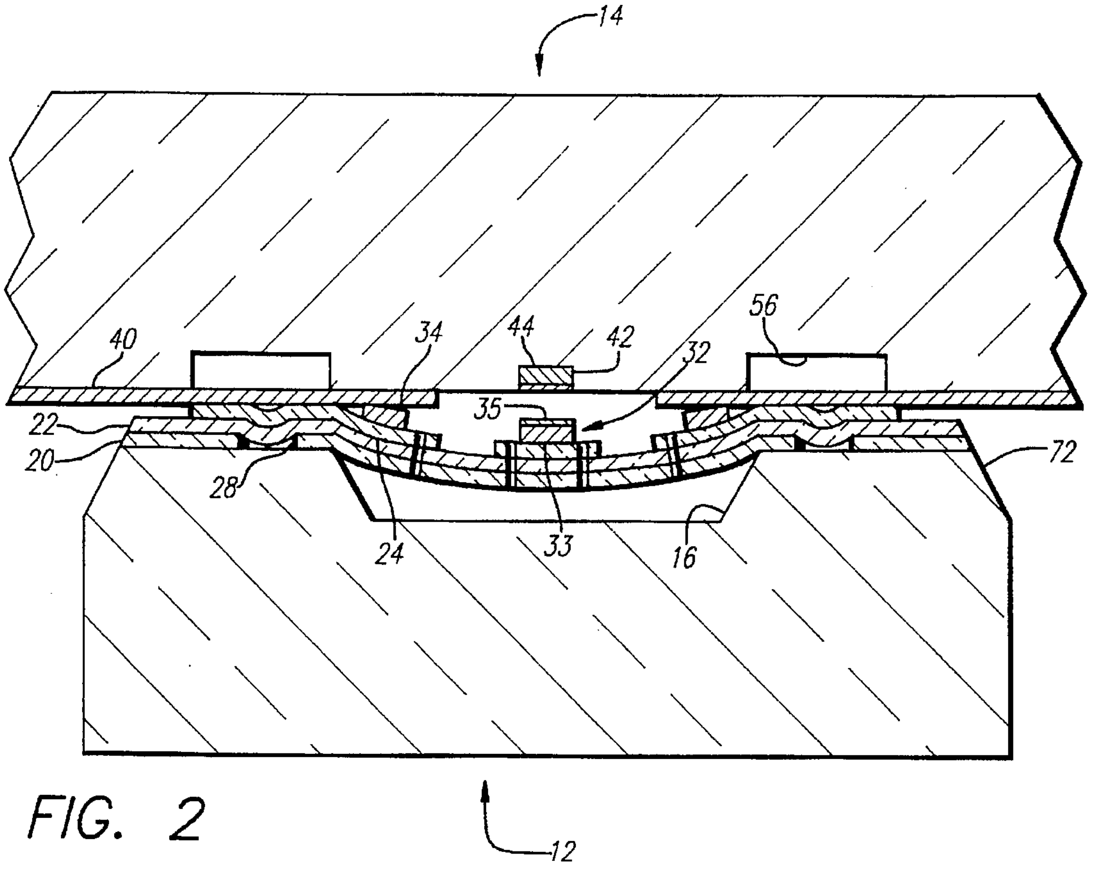
FIG. 2
FIG. 3
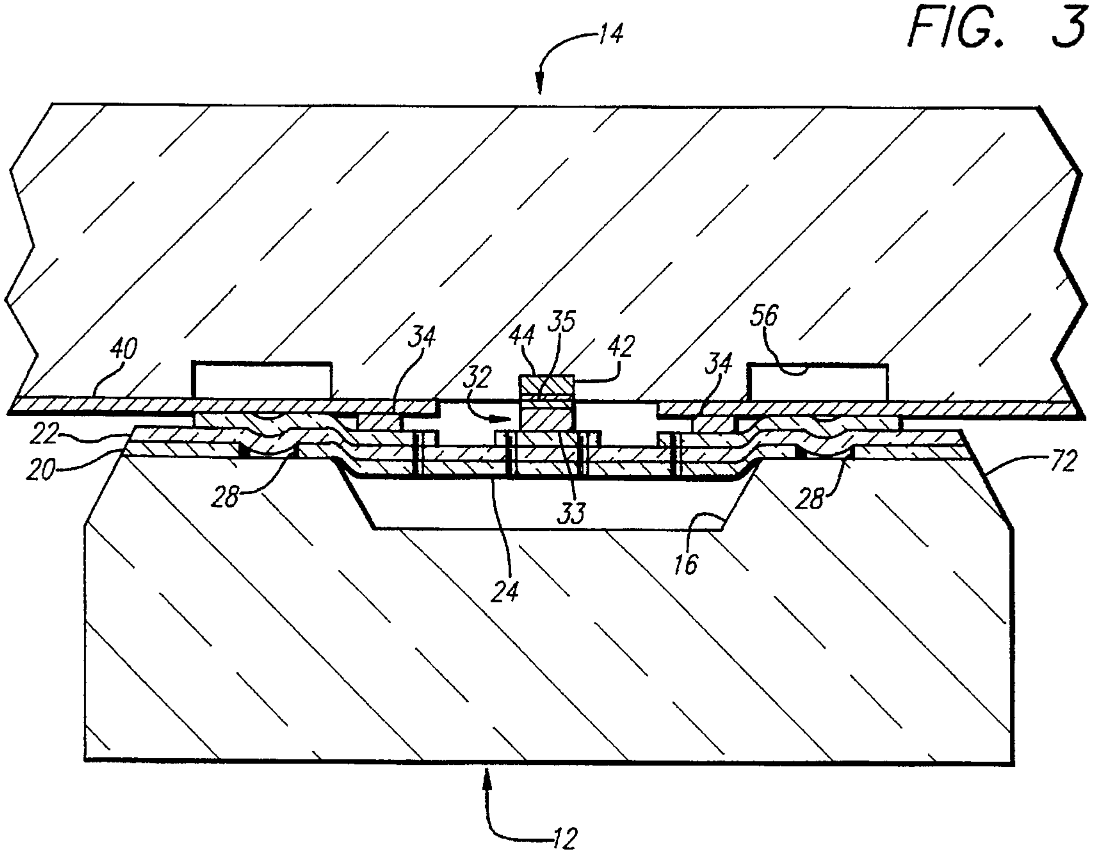

MICROMACHINED RELAY AND METHOD OF FORMING THE RELAY

This is a continuation of application Ser. No. 08/012,055 filed Feb. 1, 1993 now U.S. Pat No. 5,479,042.

This invention relates to micromachined relays made from materials such as semiconductor materials. The invention also relates to methods of fabricating such relays.

Electrical relays are used in a wide variety of applications. For example, electrical relays are used to close electrical circuits or to establish selective paths for the flow of electrical current. Electrical relays have generally been formed in the prior art by providing an electromagnet which is energized to attract a first contact into engagement with a second contact. Such relays are generally large and require a large amount of power, thereby producing a large amount of heat. Furthermore, since the magnetic fields cannot be easily confined, they tend to affect the operation of other electrical components in the magnetic fields. To prevent other electrical components from being affected by such magnetic fields, such other components are often displaced from the magnetic fields. This has resulted in long electrical leads and resultant increases in parasitic capacitances. The circuits including the electrical relays have thus been limited in their frequency responses.

As semiconductor chips have decreased in size, their frequency responses have increased because of the decreases in the sizes of the transistors in the semiconductor chips. Furthermore, the number of transistors in the semiconductor chips has increased even as the sizes of the semiconductor chips have decreased. The resultant increases in the complexities of the circuits on the chips have necessitated an increase in the number of pads communicating on the chips with electrical circuitry external to the chips even as the sizes of the chips have decreased. The problems of testing the chips for acceptance have accordingly been compounded because of the decreased sizes of the chips, the increased frequency responses of the chips and the increased number of bonding pads on the chips.

All of the parameters specified in the previous paragraph have dictated that relays in the equipment for testing the chips should have a minimal size, an optimal frequency response, a reliable operation and a low consumption of power. These parameters have become increasingly important because the number of relays in the testing equipment has multiplied as the circuitry on the chips has become increasingly complex and the number of pads on the chips has increased. These parameters have made it apparent that the relays, such as the electromagnetic relays, used in other fields are not satisfactory when included in systems for testing the operation of semiconductor chips.

It has been appreciated for some time that it would be desirable to micromachine relays from materials such as semiconductor materials. If fabricated properly, these relays would provide certain advantages. They would be small and would consume minimal amounts of energy. They would be capable of being manufactured at relatively low cost. They would be operated by electrostatic fields rather than electromagnetic fields so that the effect of the electrostatic field of each relay would be relatively limited in space. They would be operative at high frequencies.

Many attempts have been made, and considerable amounts of money have been expended, over a substantial number of years to produce on a practical basis electrostatically operated micro-miniature relays using methods derived from micro-machined pressure transducers and accelerometers. These methods have been used because pressure transducers and accelerometers have been produced by micro-machining methods. In spite of such attempts and such expenditures of money, a practical micro-miniature relay capable of being produced commercially, rather than on an individual basis in the laboratory, and capable of providing a miniature size, a high frequency response and low consumption of power has not yet been provided.

The work thus far in micro-machined pressure transducers, accelerometers and relays has been set forth in "Microsensors" edited by Richard S. Miller and published in 1990 by the IEEE Press in New York City. The chapter entitled "Silicon as a Mechanical Medium" by Kurt E. Peterson on pages 39–76 of this publication are especially pertinent. Pages 69–71 of this chapter summarize the work performed until 1990 on micromachined relays. These pages include FIGS. 57–61.

The relays discussed in the IEEE publication have been demonstrated to function at times in the laboratory but they have difficulties which prevent them from being used in practice. For example, they employ cantilever techniques in producing a beam which pivots on a fulcrum to move from an open position to a closed position. The cantilever beam generally employed should be free from residual stress since a curl in the cantilever beam in either of two opposite directions will result in either a stuck-shut or a stuck-open relay. Very small changes in the temperature of providing the depositions for the cantilever beam or in the gas composition or the die positions can produce these stresses. These curls in the cantilever beam are illustrated in FIG. 59 on page 70 of the IEEE publication.

Relays made by the micro-machining methods discussed in the IEEE publication exhibit a large number of stuck-open contacts. The difficulties result from the small forces available from electrostatic attraction. Although these forces are sufficient to move the movable contact into engagement with the stationary contact, they are insufficient to produce an engagement between the electrically conductive materials on the contacts. This results from the fact that there may be a thin layer of contamination on each of the contacts. Such contamination may result in part from traces of photoresist from the contacts. Removal of these traces of photoresist from the contacts has not been possible because of the small clearances between the contacts. These small clearances have been in the order of micro inches.

The small clearances between the movable and stationary contacts in the prior art micromachined relays have been shielded from plasma bombardment for cleaning purposes. They have also tended to retain the solvent carrying a residue of photoresist from capillary action. Furthermore, the contacts have tended to build insulating layers from pressure-induced polymerization of atmospheric vapors. Thus, particles as small as one micrometer in diameter can prevent the electrically conductive material in the contacts from engaging at the forces produced by the electrostatic field between the contacts. This is discussed on pages 172–174 of "Electrical Contacts" prepared by Ragnar Holm and published by Springer-Verlag, Berlin/Heidelberg.

This invention provides a micro-machined relay which overcomes the disadvantages discussed in the previous paragraphs. The micromachined relay has been produced in a form capable of being provided commercially since wafers each containing a substantial number of such relays have been fabricated, the relays being fabricated on the wafers by micro-machining methods which have been commonly used in other fields. When the relays have been tested, they have been found to operate properly in providing an electrical continuity between the movable and stationary contacts in the closed positions of the stationary contacts. Furthermore, the contacts do not become stuck in the closed positions.

In one embodiment of the invention, a bridging member extends across a cavity in a semiconductor substrate (e.g. signal crystal silicon). The bridging member has successive layers—a masking layer, an electrically conductive layer (e.g. polysilicon) and an insulating layer (e.g. $SiO_2$). A first electrical contact (e.g. gold coated with ruthenium) extends on the insulating layer in a direction perpendicular to the extension of the bridging member across the cavity. A pair of bumps (e.g. gold) may be disposed on the insulating layer each between the contact and one of the opposite cavity ends. Initially the bridging member and then the contact and the bumps are formed on the substrate and then the cavity is etched in the substrate through holes in the bridging member.

A pair of second electrical contacts (e.g. gold coated with ruthenium) are on the surface of an insulating substrate (e.g. pyrex glass) adjacent the semiconductor substrate. The two substrates are bonded after the contacts are cleaned. The first contact is normally separated from the second contacts because the bumps engage the adjacent surface of the insulating substrate. When a voltage is applied between an electrically conductive layer on the insulating substrate surface and the polysilicon layer, the bridging member is deflected so that the first contact engages the second contacts.

Electrical leads extend on the surface of the insulating substrate from the second contacts to bonding pads disposed adjacent a second cavity in the semiconductor substrate. The resultant relays on a wafer may be separated from the wafer by sawing the semiconductor and insulating substrates at the position of the second cavity in each relay to expose the pads for electrical connections.

In the drawings:

FIG. 2 is a fragmentary elevational view similar to that shown in FIG. 1 with the two (2) substrates bonded to define an operative embodiment and with the electrical contacts in an open relationship;

FIG. 3 is a fragmentary elevational view similar to that shown in FIG. 2 with the electrical contacts in a closed relationship;

Figure 1:
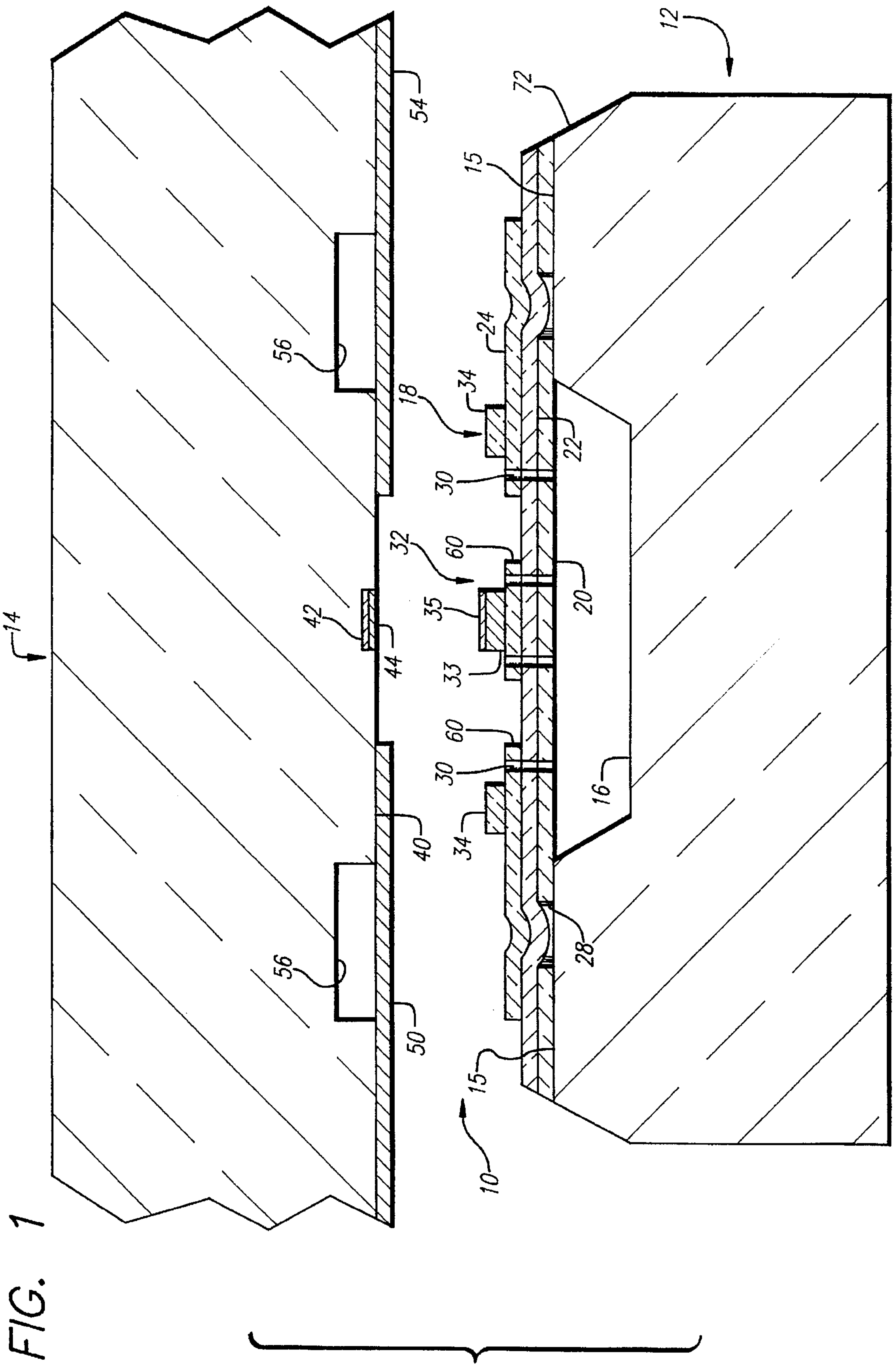
FIG. 1 is an exploded sectional view, taken substantially on the lines 1A—1A of FIG. 4 and the lines 1B—1B in FIG. 5, of a micromachined relay constituting one embodiment of the invention before the two (2) substrates included in such embodiment have been bonded to form the relay.

In one embodiment of the invention, a micromachined relay generally indicated at 10 (FIG. 1) includes a substrate generally indicated at 12 and a substrate generally indicated at 14. The substrate 12 may be formed from a single crystal of a suitable anisotropic semiconductor material such as silicon. The substrate 14 may be formed from a suitable insulating material such as a pyrex glass. The use of anisotropic silicon for the substrate 12 and pyrex glass for the substrate 14 is advantageous because both materials have substantially the same coefficient of thermal expansion. This tends to insure that the relay 10 will operate satisfactorily with changes in temperature and that the substrates 12 and 14 can be bonded properly at elevated temperatures to form the relay.

The substrate 12 includes a flat surface 15 and a cavity 16 which extends below the flat surface and which may have suitable dimensions such as a depth of approximately twenty microns (20μ), a length of approximately one hundred and thirty microns (130μ) (the horizontal direction in FIG. 4) and a width of approximately one hundred microns (100μ) (the vertical direction in FIG. 4). A bridging member generally indicated at 18 extends across the cavity 16. The bridging member 18 is supported at its opposite ends on the flat surface 15.

A masking layer 20, an electrically conductive layer 22 on the masking layer 20 and an insulating layer 24 on the electrically conductive layer 22 are disposed in successive layers to form the bridging layer 18. The layers 20 and 24 may be formed from a suitable material such as silicon dioxide and the electrically conductive layer 22 may be formed from a suitable material such as a polysilicon. The layer 22 may be doped with a suitable material such as arsenic or boron to provide the layer with a sufficient electrical conductivity to prevent any charge from accumulating on the layer 24. The masking layer 20 prevents the electrically conductive layer 22 from being undercut when the cavity 16 is etched in the substrate 12. The layers 20, 22 and 24 may respectively have suitable thicknesses such as approximately one micron (1μ), one micron (1μ), and one micron (1μ). The masking layer 20 may be eliminated wholly or in part without departing from the scope of the invention.

Figure 4:
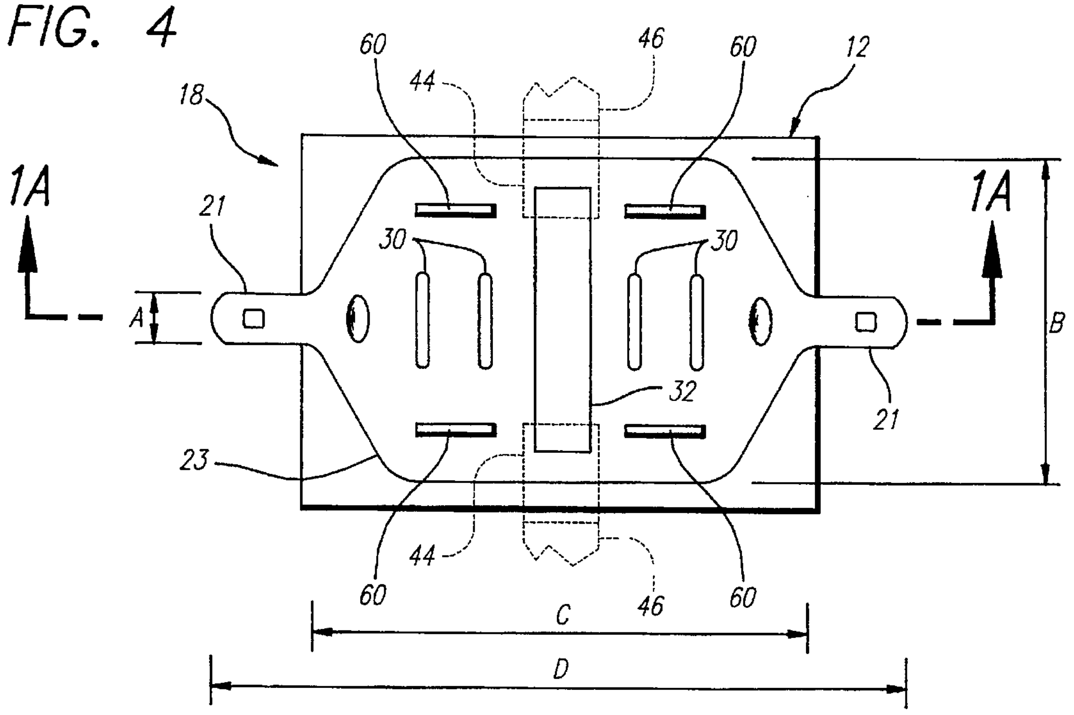
FIG. 4 is a plan view of components included in one of the substrates, these components including a bridging member holding one of the electrical contacts in the relay.

As will be seen in FIG. 4, the parameters of the bridging member 18 may be defined by several dimensions which are respectively indicated at A, B, C and D. In one embodiment of the invention, these dimensions may be approximately twenty four microns (24μ) for the dimension A, approximately ninety microns (90μ) for the dimension B, approximately one hundred and forty four microns (144μ) for the dimension C and approximately two hundred and fifty four microns (254μ) for the dimension D.

As will be seen, the bridging member 18 has the configuration in plan view of a ping pong racket 23 with relatively thin handles 21 at opposite ends instead of at one end as in a ping pong racket. The handles 21 are disposed on the flat surface 15 of the substrate 12 to support the bridging member 18 on the substrate. As will be seen, the configuration of the bridging member provides stability to the bridging member and prevents the bridging member from curling. This assures that an electrical contact on the bridging member 18 will engage electrical contacts on the substrate 14 in the closed position of the switch 10, as will be described in detail subsequently.

The layer 20 may be provided with openings 28 (FIGS. 1–3) at positions near its opposite ends. The openings may be provided with dimensions of approximately six microns (6μ) in the direction from left to right in FIGS. 1–3. The polysilicon layer 22 and the insulating layer 24 may be anchored in the openings 28. This insures that the bridging member 18 will be able to be deflected upwardly and downwardly in the cavity 16 while being firmly anchored relative to the cavity.

The layers 20, 22 and 24 may be provided with holes 30 (FIG. 4) at intermediate positions along the dimension C of racket portion 23 of the bridging member 18. The function of the holes 30 is to provide for the etching of the cavity 16, as will be discussed in detail subsequently. Each of the holes 30 may be provided with suitable dimensions such as a dimension of approximately fifty microns (50μ) in the vertical direction in FIG. 4 and a dimension of approximately six microns (6μ) in the horizontal direction in FIG. 4. The cavity 16 may be etched not only through the holes 30 but also around the periphery of the bridging member 18 by removing the masking layer 20 from this area.

An electrical contact generally indicated at 32 (FIGS. 1–4) is provided on the dielectric layer 24 at a position intermediate the length of the cavity 16. The contact 32 may be formed from a layer 33 of a noble metal such as gold coated with a layer 35 of a noble metal such as ruthenium. Ruthenium is desirable as the outer layer of the contact 32 because it is hard, as distinguished from the ductile properties of gold. This insures that the contact 32 will not become stuck to electrical contacts on the substrate 14 upon impact between these contacts. If the contact 32 and the contacts on the substrate 14 become stuck, the switch formed by the contacts cannot become properly opened.

The contact 32 may have a suitable width such as approximately eighty microns (80μ) in the vertical direction in FIGS. 1–4 and a suitable length such as approximately ten microns (10μ) in the horizontal direction in FIG. 4. The thickness of the gold layer 33 may be approximately one micron (1μ) and the thickness of the ruthenium layer 35 may be approximately one half of a micron (0.5μ).

Bumps 34 (FIG. 1) may also be disposed on the insulating layer 24 at positions near each opposite end of the cavity 16. Each of the bumps 34 may be formed from a suitable material such as gold. Each of the bumps 34 may be provided with a suitable thickness such as approximately one tenth of a micron (0.1μ) and a suitable longitudinal dimension such as approximately four microns (4μ) and a suitable width such as approximately eight microns (8μ). The position of the bumps 34 in the longitudinal direction controls the electrical force which has to be exerted on the bridging member 18 to deflect the bridging member from the position shown in FIG. 2 to the position shown in FIG. 3.

The substrate 14 has a smooth surface 40 (FIGS. 1–3) which is provided with cavities 42 to receive a pair of electrical contacts 44. Each of the contacts 44 may be made from a layer of a noble metal such as gold which is coated with a layer of a suitable material such as ruthenium. The layer of gold may be approximately one micron (1μ) thick and the layer of ruthenium may be approximately one half of a micron (0.5μ) thick. The layer of ruthenium in the contacts 44 serves the same function as the layer of ruthenium 35 in the contact 32.

By providing the cavities 42 with a particular depth, the ruthenium on each of the contacts 44 may be substantially flush with the surface 40 of the substrate 14. The contacts 44 are displaced from each other in the lateral direction (the vertical direction in FIG. 4) of the relay 10 to engage the opposite ends of the contact 32. Electrical leads **46*a* and 46*b* (FIG. 5) extend on the surface 40 of the substrate 14 from the contacts 44 to bonding pads 48*a* and 48*b***.

Figure 5:
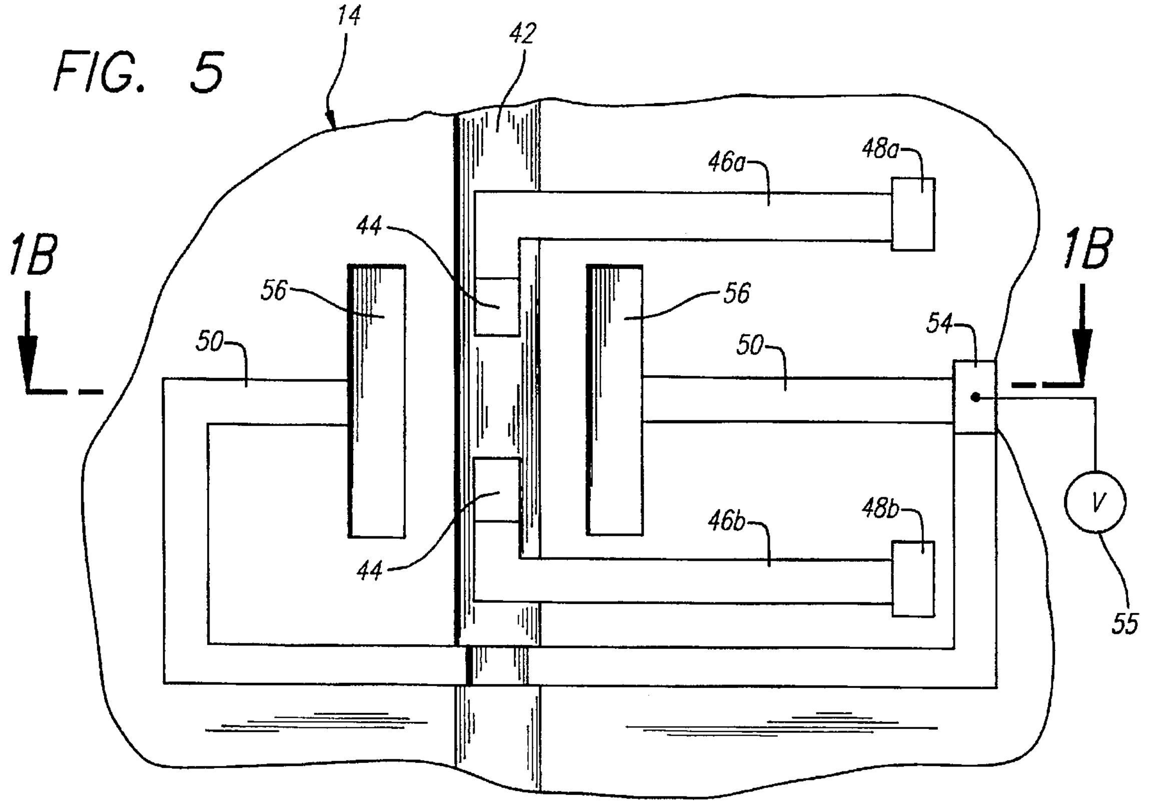
FIG. 5 is a schematic plan view of components in the other substrate and schematically shows the electrical leads and bonding pads for individual ones of the electrical contacts in the relay and the electrical lead and bonding pad for introducing an electrical voltage to the relay for producing an electrostatic field to close the relay.

Electrically conductive layers 50 made from a suitable material such as gold are also provided on the surface 40 of the substrate 14 in insulated relationship with the contacts 44 and the electrical leads 46. The electrically conductive layers 50 extend on the surface 40 of the substrate 14 to a bonding pad 54 (FIG. 5). The bonding pad 54 may be connected to a source of direct voltage 55 which is external to the relay 10.

Cavities 56 (FIGS. 1–3) may be provided in the surface 40 of the substrate 14 at positions corresponding to the positions of the openings 28 in the layer 20. The cavities 56 are provided to receive the polysilicon layer 22 and the insulating layer 24 so that the surface 15 of the substrate 12 will be flush with the surface 40 of the substrate 14 when the substrates 12 and 14 are bonded to each other to form the relay 10. This bonding may be provided by techniques well known in the art. For example, the surface 15 of the substrate 12 and the surface 40 of the substrate 14 may be provided with thin gold layers which may be bonded to each other. Before the substrates 12 and 14 are bonded μo each other, a vacuum or other controlled atmosphere may be formed in the cavity 16 by techniques well known in the art. The surfaces of the contacts 32 and 44 are also thoroughly cleaned before the surface of the substrate 12 and the surface 40 of the substrate 44 become bonded.

When the substrates 12 and 14 are bonded to each other, the surface 40 of the substrate 14 engages the bumps 34 to the bridging member 18 and deflects the bridging member downwardly so that the contact 32 is displaced from the contacts 44. This is shown in FIG. 2. When a suitable voltage such as a voltage in the range of approximately fifty volts (50 V) to one hundred volts (100 V.) is applied from the external source 55 to the bonding pad 54 and is introduced to the conductive layers 50, a voltage difference appears between the layers 50 and the polysilicon layer 22, which is effectively at ground. This voltage difference causes a large electrostatic field to be produced in the cavity 16 because of the small distance between the contact 32 and the contacts 44.

The large electrostatic field in the cavity 16 causes the bridging member 18 to be deflected from the position shown in FIG. 2 to the position shown in FIG. 3 so that the contact 32 engages the contacts 44. The engagement between the contact 32 and the contacts 44 is with a sufficient force so that the ruthenium layer on the contact 32 engages the ruthenium layer on the contacts 44 to establish an electrical continuity between the contacts. The hard surfaces of the ruthenium layers on the contact 32 and the contacts 44 prevent the contacts from sticking when the electrostatic field is removed.

When the contact 32 engages the contacts 44, the engagement occurs at the flat surfaces of the contacts. This results from the fact that the bridging member 18 is supported at its opposite ends on the surface 15 of the substrate and is deflected at positions between its opposite ends. It also results from the great width of the bridging member 18 over the cavity 16. These parameters cause the racket portion 23 of the bridging member 18 to have a disposition substantially parallel to the surface 40 of the substrate 14 as the racket portion 23 moves upwardly to provide an engagement between the contact 32 and the contacts 44. Stated differently, these parameters prevent the racket portion 23 from curling as in the prior art. Curling is undesirable because it renders the closing of the contacts 32 and 44 uncertain or renders uncertain the continued closure of the contacts after the contacts have been initially closed.

Since the electrostatic field between the contact 32 and the contacts 44 is quite large such as in the order of megavolts per meter, electrons may flow to or from the insulating layer 24. If these electrons were allowed to accumulate in the cavity 16, they could seriously impair the operation of the relay 10. To prevent this from occurring, the insulating layer 24 may be removed where not needed as at areas 60 so that the polysilicon layer 22 becomes exposed in these areas. The polysilicon layer has a sufficient conductivity to dissipate any charge that tends to accumulate on the insulating layer 24. The isolated areas 60 in the polysilicon layer 22 are disposed in areas on the electrically insulating layer 24 of the bridging member 18 in electrically isolated relationship to the bumps 34 and the contact 32. The charges pulled from or to the dielectric layer 24 are accordingly neutralized by the flow of an electrical current of low amplitude through the polysilicon layer 22.

Figure 6:
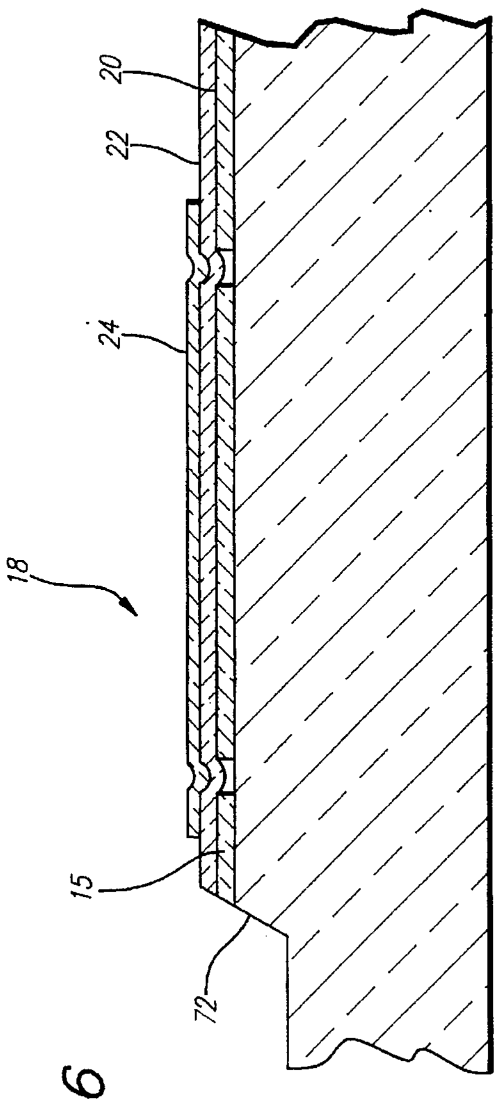
FIG. 6 is an elevational view illustrating one of the substrates shown in FIGS. 1–3 at an intermediate step in the formation of the substrate.

The substrates 12 and 14 may be formed by conventional techniques and the different layers and cavities may be formed on the substrates by conventional techniques. For example, the deposition of metals may be by sputtering techniques, thereby eliminating deposited organic contamination. The bridging member 18 may be formed on the surface 15 of the substrate 12 as shown in FIG. 6 before the formation of the cavity 16. The cavity 16 may thereafter be formed in the substrate by etching the substrate as with an acid through the holes 30 in the bridging member including holes in the masking layer.

A cavity 72 may also be etched in the substrate 12 at the opposite longitudinal ends of the relay 10 at the same time that the cavity 16 is etched in the substrate. The cavity 72 at one longitudinal end is disposed at a position such that the pads 48*a* and 48*b* and the pad 54 (FIG. 5) are exposed. This facilitates the external connections to the pads 48*a* and 48*b* and the pad 54. The cavities 16 and 72 may then be evacuated and the substrates 12 and 14 may be bonded, by techniques well known in the art, at positions beyond the cavities 56. Before the substrates 12 and 14 are bonded, the contacts 32 and 44 may be thoroughly cleaned to assure that the relay will not be contaminated. This assures that the relay will operate properly after the substrates 12 and 14 have been bonded.

Figure 7:
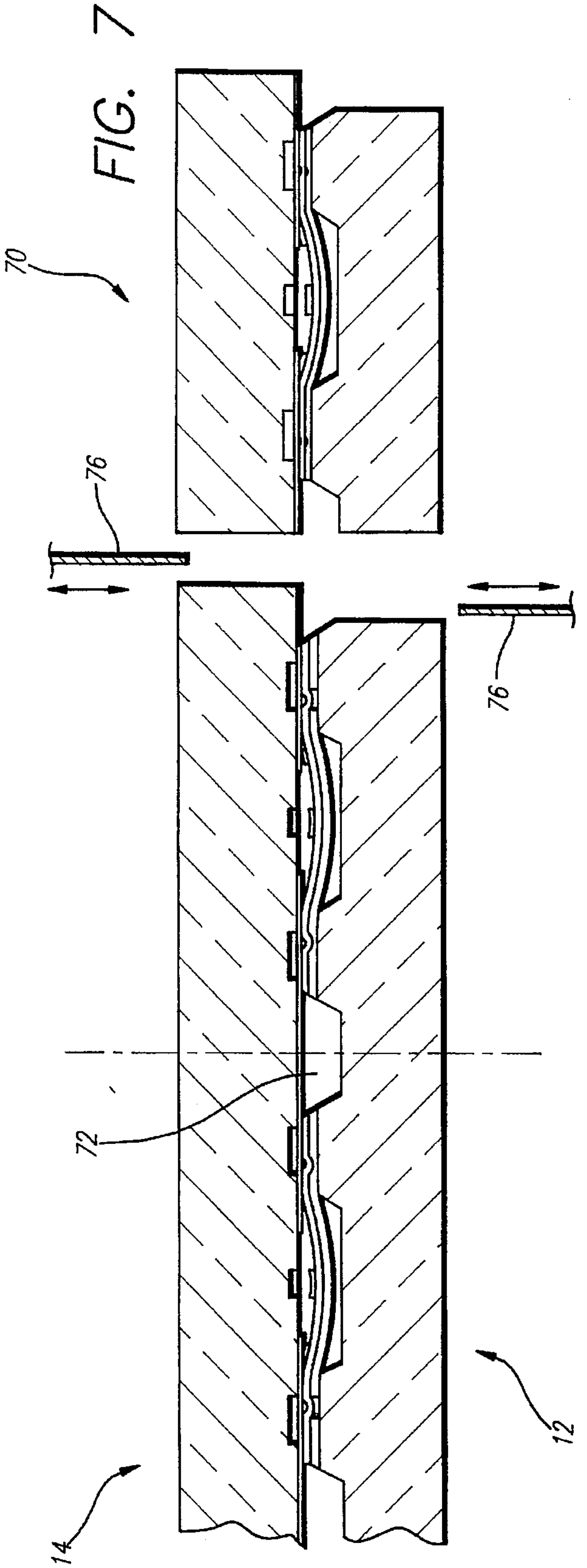
FIG. 7 is a fragmentary schematic elevational view of a wafer fabricated with a plurality of the relays on the wafer with one of the relays individually separated from the wafer.

A plurality of relays 10 may be produced in a single wafer generally indicated at 70 (FIG. 7). When this occurs, one of the cavities 72 (FIGS. 1–3 and 7) may be produced between adjacent pairs of the relays 10 in the wafer 70. The relays 10 may be separated from the wafer 70 at the positions of the cavities 70 as by carefully cutting the wafer as by a saw 76 at these weakened positions. The substrate 12 is cut at a position closer to the cavity 16 than the substrate 14, as indicated schematically in FIG. 7, so that the bonding pads 48*a*, 48*b* and 54 are exposed. In this way, external connections can be made to the pads 48*a*, 48*b* and 54. By forming the relays 10 on a wafer 70, as many as nine (9) relays may be formed on the wafer in an area having a length of approximately three thousand microns (3000μ) and a width of approximately twenty five hundred microns (2500μ).

The relays 10 of this invention have certain important advantages. They can be made by known micromachining techniques at a relatively low cost. Each relay 10 provides a reliable engagement between the contacts 32 and 44 in the closed position of the contacts without any curling of the contact 32. This results in part from the support of the bridging member 18 at its two (2) opposite ends on the surface 15 of the substrate 12 and from the shaping of the bridging member in the form of a modified ping pong racket. Furthermore, the bumps 34 are displaced outwardly from the contact 32, thereby increasing the deflection produced upon the flexure of the bridging member when the contact 32 moves into engagement with the contacts 44. The wide shape of the bridging member 18 overcomes any tendency for the contact 32 to engage only one of the contacts 44.

The relays are also formed so that any contamination is removed from the relays before the substrates 12 and 14 are bonded. The relays are also advantageous in that the substrates 12 and 14 are bonded and in that the contacts 44 and the pads 48*a*, 48*b* and 54 are disposed on the surface of the substrate 14 in an exposed position to facilitate connections to the pads from members external to the pads.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

What is claimed is:

1. In combination, a first substrate having a cavity, a bridging member supported at its opposite ends on the first substrate at the opposite ends of the cavity in the first substrate and extending into the cavity at an intermediate position, a first electrical contact on the bridging member at an intermediate position on the bridging member, a second substrate made from an insulating material and having at least a second electrical contact disposed to engage the first electrical contact, the second substrate being made from a different material than the material of the first substrate, means on the bridging member for displacing the first electrical contact from the second electrical contact, and means for providing for a movement of the bridging member at selective times into an engagement of the first and second electrical contacts, the materials of the first and second substrates being bonded directly to each other at positions beyond the cavity to enclose the cavity.

2. In a combination as set forth in claim 1, the opposite ends of the bridging member being disposed in a first direction, the second electrical contact constituting a pair of spaced contacts extending in a second direction transverse to the first direction, and electrical leads extending from the spaced contacts constituting the second electrical contact.

3. In a combination as set forth in claim 1, there being an externally disposed second cavity in the first substrate to expose the second substrate at the position of the second cavity, a bonding pad on the second substrate at the position of the second cavity, and an electrical lead extending from the second contact to the bonding pad.

4. In a combination as set forth in claim 3, the bridging member including a masking layer, a layer of an electrically conductive material disposed on the masking layer and a layer of an electrically insulating material disposed on the layer of electrically conductive material.

5. In combination, a first substrate made from a semiconductor material, a second substrate made from an insulating material, the insulating material of the second substrate being made from a different material than the semiconductor material of the first substrate and the insulating material of the second substrate being bonded directly to the semiconductor material of the first substrate, a cavity disposed in the first substrate and enclosed by the direct bonding of the semiconductor material of the first substrate and the insulating material of the second substrate, a bridging member supported by the first substrate at positions on the first substrate beyond the cavity and extending across the cavity, a first electrical contact disposed on the bridging member at a position above the cavity, a second electrical contact disposed on the second substrate in facing relationship with the first electrical contact, means disposed on one of the substrates between the positions of the support of the bridging member on the first substrate for producing a spacing between the first and second electrical contacts, and means for moving the bridging member to a position of engagement between the first electrical contact and the second electrical contact by applying an electrical field between the first and the second electrical contacts.

6. In a combination as set forth in claim 5, the bridging member being deposited on the first substrate before the formation of the cavity, the bridging member including a layer of an insulating material with the first electrical contact disposed on the layer of the electrically insulating material in facing relationship to the second electrical contact in the cavity, the electrical field providing the only force to move the bridging member to the position of engagement between the first and second electrical contacts.

7. In a combination as set forth in claim 5, the cavity constituting a first cavity, a second cavity in the first substrate at an externally disposed position displaced from the first cavity, and an electrical lead extending along the surface of the second substrate from the second electrical contact to the position of the second cavity in the first substrate, there being holes in the bridging member, the cavity being formed by the etching of the first substrate through the holes in the bridging member.

8. In combination, a bridging member, a substrate made from an electrically insulating material and supporting the bridging member at a pair of spaced positions for a pivotable movement of the bridging member in the length between the spaced positions, the bridging member including a masking layer having holes disposed at the spaced positions on the substrate, the bridging member including a layer of electrically conductive material disposed on the masking layer for pivotal movement with the layer of insulating material and supported in the holes, a layer of electrically insulating material on the layer of electrically conductive material, and an electrically conductive contact disposed on the layer of electrically insulating material at an intermediate position in the length of the bridging member between the pair of spaced positions.

9. In a combination as set forth in claim 8, the substrate having a cavity between the spaced positions, additional holes disposed in the bridging member at intermediate positions above the cavity in the length of the bridging member between the pair of spaced positions to provide for the etching of the cavity in the substrate after the formation of the bridging layer on the substrate, the cavity being formed by the passage of etching material through the additional holes in the bridging member.

10. In combination, a bridging member, a substrate made from an electrically insulating material and supporting the bridging member at a pair of spaced positions for a pivotable movement of the bridging member in the length between the spaced positions, the bridging member including a masking layer having holes disposed at the spaced positions on the substrate, the bridging member including a layer of electrically conductive material disposed on the masking layer for pivotal movement with the layer of insulating material and supported in the holes, a layer of electrically insulating material on the layer of electrically conductive material, and an electrically conductive contact disposed on the layer of electrically insulating material at an intermediate position in the length of the bridging member between the pair of spaced positions, bumps disposed on the bridging member at positions between the electrical contact and the spaced positions to bias the electrically conductive contact from completing an electrical circuit.

11. In a combination as set forth in claim 8, a second substrate made from an electrically insulating material and bonded to the first substrate, and a second electrically conductive contact disposed on the second substrate for engagement with the first electrically conductive contact, the second substrate being made from a different material than the first substrate.

12. In combination in a relay having externally disposed electrical connections, a substrate made from a semiconductor material, a cavity disposed in the substrate and having opposite ends, a bridging member supported on the substrate at the opposite ends of the cavity, the bridging member being supported by the substrate for pivotal movement relative to the opposite ends of the cavity, the bridging member being made from successive layers of an insulating material, an electrically conductive material on the layer of the insulating material and an insulating material on the layer of the electrically conductive material, the insulating layer on the layer of the electrically conductive material being partially removed to partially expose the layer of the electrically conductive material, and an electrical contact disposed on the top layer of the bridging member between the opposite ends of the cavity.

13. In a combination as set forth in claim 12, a second cavity externally disposed in the substrate at a position displaced from the first cavity to expose the externally disposed electrical connections in the relay.

14. In combination in a micromachined relay, a substrate made from a semiconductor material, a cavity disposed in the substrate and having opposite ends, a member bridging the cavity, the bridging member being supported by the substrate for pivotal movement relative to the opposite ends of the cavity as fulcrums, the bridging member including a masking layer made from an insulating material, a layer of an electrically conductive material on the masking layer and a layer of an electrically insulating material on the layer of the electrically conductive material, the masking layer, the layer of the electrically conductive material and the layer of the electrically insulating material being made from materials different from the material of the substrate, and an electrical contact disposed on the layer of the insulating material at an intermediate position between the opposite ends of the cavity.

15. In combination in a micromachined relay, a substrate made from a semiconductor material having properties of being anisotropically etched, a cavity disposed in the substrate and formed from an anisotropic etching of the substrate and having opposite ends, a bridging member supported on the substrate at the opposite ends of the cavity, the bridging member being provided with at least one hole, the cavity being formed by the passage of etching material through the hole in the bridging member, and an electrical contact disposed on the bridging member at an intermediate position between the opposite edges of the cavity, the bridging member having a composition different from that of the substrate.

16. In a combination as set forth in claim 15, the bridging member including a masking layer made from an electrically insulating material, an electrically conductive layer on the masking layer and an insulating layer on the masking layer, the masking layer, the electrically conductive layer and the insulating layer being provided with holes at matching positions, the electrical contact being disposed on the insulating layer.

17. In a combination as set forth in claim 15, the cavity constituting a first cavity, and a second cavity disposed in the substrate at a position displaced from the first cavity and externally disposed in the micromachined relay to define one of the boundaries of the micromachined relay, a portion of the insulating layer being removed to expose the electrically conductive layer.

18. In combination in a micromachined relay including a bridging member, a substrate made from an insulating material and having a first surface, a pair of electrical contacts disposed on the first surface of the insulating material in displaced relationship to each other in a first direction, a layer of an electrically conductive material disposed on the first surface of the insulating material in a displaced relationship to the electrical contacts for creating an electrical field between the layer of the electrically conductive material and the bridging member, and a first pair of cavities disposed in the first surface of the insulating material at positions displaced from the layer of the electrically conductive material and the electrical contacts to receive the opposite ends of the bridging member in substantially flush relationship with the first surface, and a second pair of cavities disposed in the first surface of the insulating material at positions corresponding to the pair of electrical contacts for holding the pair of electrical contacts in substantially flush relationship with the first surface of the insulating material.

19. In a combination as set forth in claim 18, a pair of electrical leads disposed on the first surface of the insulating material, each of the leads extending from an individual one of the contacts to a position beyond one of the cavities in the first pair, and a pair of bonding pads disposed on the first surface of the substrate, each bonding pad being connected to an individual one of the leads at the end of the lead opposite the associated one of the contacts in the pair.

20. In a combination as recited in claim 19, the insulating material constituting a glass capable of retaining its dielectric properties at elevated temperatures.

21. In a combination as recited in claim 20, an additional pad disposed on the first surface of the substrate and electrically connected to the layer of the electrically conductive material, and means for introducing an electrical voltage to the additional pad to produce an electrical field between the first surface of the substrate and the bridging member.

22. In combination, a first insulating material having a first surface, a first electrical contact supported on the first surface, a second insulating material having a second surface, the first insulating material being different than the second insulating material, a cavity disposed in the second surface and having opposite ends, the first and second insulating materials being bonded directly to each other at the first and second surfaces to enclose the cavity, movable means disposed in the cavity and supported on the second surface of the second insulating material at the opposite ends of the cavity, a second electrical contact disposed on the movable means for engagement with the first electrical contact, means disposed on the movable means in the cavity for biasing the movable means against engagement of the second electrical contact with the first electrical contact, and means disposed on the first surface for creating an electrical field between the first surface and the movable means, thereby producing a movement of the movable means to a position in which the second electrical contact engages the first electrical contact.

23. In a combination as set forth in claim 22, the second insulating material having semiconductor properties, the first insulating material being different from the second insulating material, the means for creating the electrical field including a conductive layer disposed on the first surface.

24. In a combination as set forth in claim 23, the semiconductor material having anisotropic properties, the movable means having holes to provide for the anisotropic etching of the cavity in the semiconductor material, and the biasing means mechanically biasing the movable means against engagement of the second electrical contact with the first electrical contact.

25. In a combination as set forth in claim 22, a second cavity externally disposed in the second surface, at least one electrical lead extending on the first surface from the first electrical contact to the position of the externally disposed second cavity, and a bonding pad at the end of the electrical lead adjacent the second cavity, the means for creating the electrical field providing the only force for moving the second electrical contact into engagement with the first electrical contact.

26. In combination, a first fixedly positioned electrical contact, a second electrical contact movably disposed relative to the first electrical contact for engagement with the first electrical contact, first means having first and second opposite ends, second means for supporting the first means at the opposite ends of the first means, the first means being movable at intermediate positions relative to its opposite ends, the second electrical contact being disposed on the first means for movement with the first means into engagement with the first electrical contact, third means disposed between the opposite ends of the first means for mechanically biasing the first means relative to the first electrical contact for displacement of the second electrical contact from the first electrical contact, and fourth means for producing an electrical field between the first electrical contact and the first means, thereby moving the first means into an engagement between the first electrical contact and the second electrical contact.

27. In a combination as set forth in claim 26, an electrical lead extending from the first electrical contact, a bonding pad at the end of the electrical lead, and the second means being constructed to expose the bonding pad for external electrical connections to the bonding pad.

28. In a combination as set forth in claim 26, the second means being constructed to provide for a pivotal movement of the first means relative to the first and second opposite ends of the second means as fulcrums, the means for producing the electrical field providing the only force for moving the second electrical contact into engagement with the first electrical contact.

29. In a combination as set forth in claim 26, the first means being constructed and being provided with electrical properties to provide for a dissipation of electrostatic charges created on the first means by the electrical field.

30. In a combination as set forth in claim 27, the first means being constructed and being provided with electrical properties to provide for a dissipation of electrostatic charges created on the first means by the electrical field, and the second means being made from a semiconductor material having dielectric properties.

31. In a combination recited in claim 26, the first means including an electrically conductive layer and a dielectric layer on the electrically conductive layer, the electrically conductive layer and the dielectric layer being made from materials different from the material of the second means, the dielectric layer being removed from the electrically conductive layer at isolated positions to expose the electrically conductive layer for a dissipation of electrostatic charges produced by the electrical field.

32. In combination in a relay, a first substrate made from an insulating material, first electrical contact means disposed on the insulating material of the first substrate for providing electrical signals, first pads disposed on the insulating material of the first substrate for providing for a passage from the relay of the signals on the first electrical contact means, first means disposed on the insulating material of the first substrate for producing an electrical field upon the introduction of a voltage to the first means, second pads disposed on the insulating material of the first substrate for receiving a voltage for introduction to the first means, a second substrate made from a semiconductor material, the insulating material of the first substrate being directly bonded to the semiconductor material of the second substrate, and second electrical contact means supported by the second substrate and disposed in the electrical field produced by the first means and responsive to such electrical field for movement into engagement with the first contact means upon the production of such electrical field.

33. In a combination as set forth in claim 32, the second substrate having a cavity, the second electrical contact means being disposed in the cavity for movement into engagement with the first contact means.

34. In a combination as set forth in claim 32, there being an externally disposed cavity in the second substrate at the position of the pads on the insulating material of the first substrate to expose the pads for electrical connections, the second electrical contact means constituting a bridging member having a surface facing the first means with electrically conductive properties at first positions on such surface to dissipate charges produced by the electrical field and with electrically insulating properties at second positions on such surface.

35. In a combination as set forth in claim 33, the first and second substrates being sealed as a result of the direct bonding of the materials of the first and second substrates and the cavity being evacuated.

36. In a combination as set forth in claim 33, the cavity constituting a first cavity, there being an externally disposed cavity in the second substrate at the position of the pads on the first surface of the first substrate to expose the pads for electrical connections, the first cavity being evacuated before the bonding of the insulating material of the first substrate and the semiconductor material of the second substrate, and the first means creating the only force for moving the second electrical contact means into engagement with the first electrical contact means.

37. In combination, a first substrate made from a semiconductor material, a second substrate made from an insulating material, the insulating material being different from the semiconductor material, the first substrate having a first surface of the semiconductor material, the second substrate having a first surface of the insulating material, the first surfaces of the first and second substrates being directly bonded, there being a cavity between the first surfaces of the first and second substrates in the bonded relationship of the first and second substrates, the cavity being evacuated of gases, and contacts disposed in the cavity and respectively supported by the first and second substrates and movable relative to each other in the cavity to establish an electrical continuity between the contacts.

38. In a combination as set forth in claim 37, means disposed in the cavity for producing an electrical field in the cavity between the electrical contacts supported by the first and second substrates, thereby obtaining the movement of the contacts relative to each other to establish the electrical continuity between the contacts.

39. In a combination as set forth in claim 37, means including a bridging member supporting one of the contacts in the cavity and movable with such one of the contacts to establish the electrical continuity between the contacts, and the means including the bridging member having a surface with electrically insulating properties at first positions and electrically conductive properties at second positions to dissipate any electrical charge accumulated on the bridging member in the cavity.

40. In a combination as set forth in claim 37, the contacts being disposed in a substantially parallel relationship to each other, and means associated with at least one of the contacts for retaining the substantially parallel relationship between the contacts during the movement of the contacts relative to each other to establish the electrical continuity between the contacts.

41. In a combination as set forth in claim 39, the contacts being disposed in a substantially parallel relationship to each other, means associated with at least one of the contacts for retaining the substantially parallel relationship between the contacts during the movement of the contacts relative to each other to establish the electrical continuity between the contacts, means for providing for the production of an electrical field in the cavity between the contacts, thereby establishing the electrical continuity between the contacts, and means for providing for the passage from the cavity of an electrical signal produced upon the establishment of the electrical continuity between the contacts.

42. In a combination as set forth in claim 5, the first and second substrates being evacuated of gases.

43. In a combination as set forth in claim 22, the first and second insulating materials being evacuated of gases.

* * * * *